United States Patent [19]

Ohno et al.

[11] Patent Number: 5,093,282

[45] Date of Patent: Mar. 3, 1992

[54] METHOD OF MAKING A SEMICONDUCTOR DEVICE HAVING LEAD PINS AND A METAL SHELL

[75] Inventors: Jun-ichi Ohno, Yokohama; Koh-ichi Fukazawa, Tokyo; Masamichi Shindo, Yokohama, all of Japan

[73] Assignee: Kabushiki Kaisha Toshiba, Kawasaki, Japan

[21] Appl. No.: 648,311

[22] Filed: Jan. 29, 1991

Related U.S. Application Data

[62] Division of Ser. No. 336,421, Apr. 11, 1989, abandoned.

[30] Foreign Application Priority Data

Apr. 13, 1988 [JP] Japan .................................. 63-90856

[51] Int. Cl.5 ...................... H01L 21/52; H01L 21/58; H01L 21/60
[52] U.S. Cl. .................................. 437/221; 437/915; 437/245; 174/52.4
[58] Field of Search ............... 357/72, 74; 437/8, 915, 437/221, 245; 174/52.1, 52.2, 52.3, 52.4, 52.5, 52.6; 361/406, 407, 408, 410

[56] References Cited

U.S. PATENT DOCUMENTS

| | | | |
|---|---|---|---|
| 4,307,934 | 12/1981 | Palmer | 357/74 |
| 4,514,752 | 4/1985 | Engel et al. | 357/74 |
| 4,630,096 | 12/1986 | Drye et al. | 357/74 |

FOREIGN PATENT DOCUMENTS

| | | | |
|---|---|---|---|
| 3527818 | 2/1987 | Fed. Rep. of Germany | 357/74 |
| 56-101761 | 8/1981 | Japan | 357/74 |
| 58-42259 | 3/1983 | Japan | 357/74 |
| 61-8959 | 1/1986 | Japan | 357/74 |
| 61-296743 | 12/1986 | Japan | 357/74 |
| 62-98752 | 5/1987 | Japan | 357/74 |
| 62-247554 | 10/1987 | Japan | 357/74 |
| 1-214052 | 8/1989 | Japan | 357/74 |

OTHER PUBLICATIONS

IBM Technical Disclosure Bulletin, vol. 30, No. 6, Nov. 1987, "High Performance Multi-Chip Module", p. 437.

*Primary Examiner*—Olik Chaudhuri
*Assistant Examiner*—David E. Graybill
*Attorney, Agent, or Firm*—Foley & Lardner

[57] ABSTRACT

Disclosed is a method for making a semiconductor device in which the Pin Grid Array (PGA) is improved so that a plurality of lead pins project from the undersurface of a metal base of a package substrate as input and output terminals of a Large Scale Integrated-circuit (LSI). The method comprises mounting a semiconductor chip on a heat sink to the base, superposing a printed circuit board on the base and connecting electrical lead pins to the outer ends of wiring patterns which are formed radially and downwardly projecting through the base, and assembling a metal shell to the upper surface of the base and covering the chip, bonding wires and wiring patterns, wherein the patterns are formed such that the outer ends of the patterns are located within the vicinity over the outermost rows and columns of through holes for connecting lead pins. Furthermore, in the method of producing the device, a central portion patterning wiring layer, which is electrically short-circuited for gold plating, is provided in order to stabilize the connection with the bonding wires, and this center layer is cut off after the short circuit is performed.

3 Claims, 4 Drawing Sheets

METHOD OF MAKING A SEMICONDUCTOR DEVICE HAVING LEAD PINS AND A METAL SHELL

This application is a division of application Ser. No. 07/336,421, filed Apr. 11, 1989, now abandoned.

BACKGROUND OF THE INVENTION

The present invention relates to an improvement in semiconductor devices having a high density, especially large scale integrated circuits (LSI) of the type in which a printed circuit board over the upper surface of which are defined wiring patterns, is superposed over the upper surface of a metal base and the end portions of lead pins extended through the superposed printed-circuit board and the metal base and respectively connected to their corresponding wiring patterns.

In Dual Inline Packages (DIPs) which are a typical example of pin-insertion type semiconductor packages, the number of pins which can be provided is limited and in practice, is in the order of 60. It had been impossible so far to provide more pins than this. However, in order to provide a plurality of pins in excess of the order of 60, the pin-insertion type such as Pin Grid Array (a PGA) in which a plurality of pins are extended from the undersurface of the package has been used in general.

Various types of PGAs have been proposed and demonstrated. One is the so-called ceramic type in which a plurality of ceramic substrates are metallized and laminated into a multilayer construction. Another is the so-called plastic type PGA in which printed wiring substrates are replaced by a printed circuit board in order to achieve reductions in the fabrication costs.

However, the ceramic type PGA is generally very expensive and in the case of the plastic type PGA, there arises the problem that it is generally very difficult to completely seal the wiring circuit board and a semiconductor chip, a printed circuit board or the like airtightly, so that when compared with the ceramic type PGA, the reliability of operation is inferior.

In view of the above, the same inventor proposed a semiconductor device of the type which has reliable operation and which is capable of reducing the manufacturing cost. This device is described in a pending disclosure in U.S. Ser. No. 095,256 (Japanese Patent Application Laid-Open No. 63-133553) in order to substantially solve the above and other problems encountered in the ceramic type PGA and the plastic type PGA.

That is, referring to FIGS. 1 and 2, a heat sink 2 is disposed at substantially the center portion of a metal base 1 and a semiconductor chip 3 is mounted on the upper surface of the heat sink 2. A printed circuit board 5 whose upper surface has predetermined wiring patterns 4 which are extended radially outwardly from the inner ends of the center portion around the semiconductor chip, is superposed over the upper surface of the base 1, and the inner ends of the center portion of the wiring patterns are electrically connected to the bonding pads of the semiconductor chip 3 by bonding wires 6, such as aluminum wires. When the base 1 and the board 5 are overlaid one upon the other, the upper end of the lead pin 7 is inserted into through holes 1a and 5a which are aligned with each other and insulating member 8 such as glass, is filled in the annular space defined between the through hole 1a of the base 1 and the lead pin 7 inserted thereinto. Over the upper surface of the printed circuit board 5, the wiring pattern 4 and the lead pin 7 are electrically interconnected with each other by a connecting member 9 such as solder. Furthermore, the upper surfaces of the semiconductor chip 3 and the printed circuit board 5 and their sides, are covered with a metal shell 10 so that the semiconductor chip 3 and the printed circuit board 5 are airtightly sealed.

In the case of the semiconductor device of the type described above, as shown in FIG. 5, the outer ends of the wiring patterns 4 defined over the upper surface of the printed circuit board 5 are extended to the outer peripheral end face. The reason why the device has been constructed above is described hereinafter. In the case that the wiring patterns 4 on the printed circuit board 5 are formed by copper (Cu) or the like which is a good conductor, bonding wires 6 such as aluminum wires are interconnected to the inner ends of the wiring patterns 4 formed by copper. In order to connect the bonding wire 6 such as aluminum wire to the inner end of the wiring patterns 4, the inner ends of the wiring patterns 4 are plated with gold so that the connection between the inner ends of the wiring patterns 4 and the bonding wires 6 can be securely stabilized.

That is, the production process of the conventional device will be described with reference to FIG. 4. Firstly, all the external ends of the wiring patterns 4 are extended into and around an external side of the printed circuit board 5 so that a patterning wiring layer 11 is formed in a size larger than the patterns 4 after their completion. Next, all the wiring patterns 4 are electrically short-circuited through the patterning wiring layer 11 so that the gold plating is accomplished. Lastly, after the gold plating is performed as shown in FIG. 5, the patterning wiring layer 11 is cut off so that production of the wiring patterns 4 is completed.

However, in the semiconductor device produced by the above-mentioned method for production, even though there is no problem in the case that the distance t1 between the outer peripheral side of the printed circuit board 5 and the inner surface of the upwardly extended portion of the metal shell 10 (FIG. 3) can be defined sufficiently large, but the following problems occur in making a semiconductor device as compact as possible. That is, when it is required to reduce the distance t1 as much as possible for the sake of compactness, electrical short-circuiting occurs between the external ends of the wiring patterns 4 by the contact of the inner surface of the upwardly extended portion of the metal shell 10 with one end of the wiring patterns 4. It follows therefore that there arises the problem that in order to prevent such electrical short-circuiting, the distance t1 must be inevitably increased so that the whole semiconductor device becomes larger in size.

SUMMARY OF THE INVENTION

In view of the above problems, the primary object of the present invention is to provide a semiconductor device and a method for its production in which the inner ends of the wiring patterns at the center portion of the upper surface of the printed circuit board can be plated with gold and even when the distance between the outer peripheral side of the printed circuit board and the inner surface of the upwardly extended portion of the metal shell are reduced as much as possible, electrical short circuiting between the wiring patterns can be prevented.

To the above and other ends, a semiconductor device of the present invention of the type in which a metal base is superposed over the undersurface of a printed circuit board which has wiring patterns extending radially outwardly from the inner ends at the center portion of the upper surface of the board, the upper portion of each lead pin is inserted into through holes bored in the board and the base, respectively, each lead pin is electrically connected to each external end of the wiring patterns on the upper surface of the board, and the upper and periphery sides of the board are covered with a metal shell, the semiconductor device has a construction so that each external end of the wiring patterns, which are radially and outwardly extended, is located in the vicinity of the upper opening of the through hole which is formed through the printed board and into which is inserted the lead pin.

In order to achieve the above object, the present invention provides a method for producing the semiconductor device, and has a step for forming a patterning wiring layer as a conductive layer at the center portion of the wiring patterns on the board in order to perform the short-circuiting when the gold plating is completed, a step for the gold plating by means of supplying a current to the patterning wiring layer in order to connect the wiring patterns with the corresponding bonding wire for connection of the semiconductor chip, and a step for cutting off the patterning wiring layer after processing from the wiring patterns which have been performed the gold plating.

The present invention has the above-described construction so that the electrical short-circuiting between the wiring patterns can be positively prevented and the distance between the outer peripheral side of the printed circuit board and inner surface of the upwardly extended portion of the metal shell can be reduced as much as possible and even be made zero, whereby the semiconductor device in accordance with the present invention can be made extremely compact in size.

Furthermore, the present invention has the effect that the inner ends of the wiring patterns defined at the center portion over the upper surface of the printed circuit board can be plated with gold.

DESCRIPTION OF THE PREFERRED EMBODIMENT

Now, referring to the FIGS. 6 to 10 as accompanying drawings, a preferred embodiment of a semiconductor device in accordance with the present invention will be described in detail.

Figure 1:
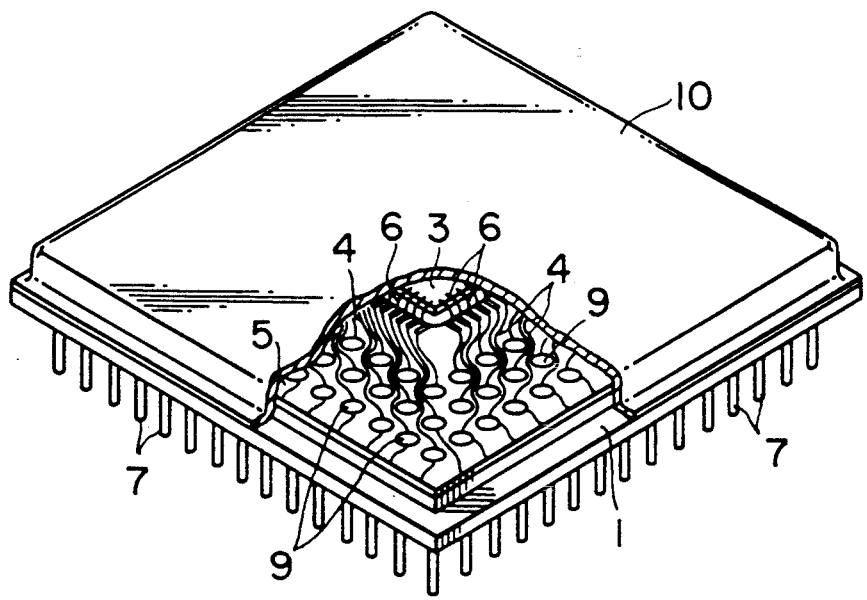
FIG. 1 is a perspective view showing the conventional semiconductor device with one part cut away.
Figure 2:
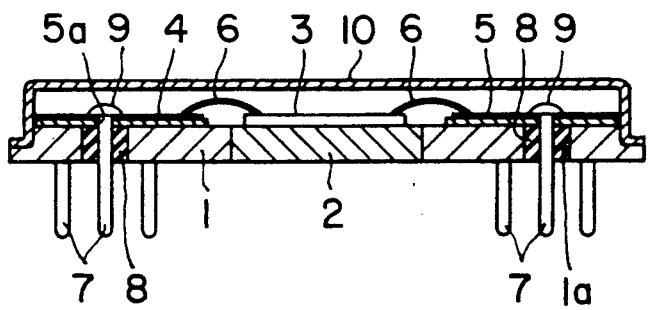
FIG. 2 is a longitudinal sectional view of the semiconductor device shown in FIG. 1.
Figure 3:
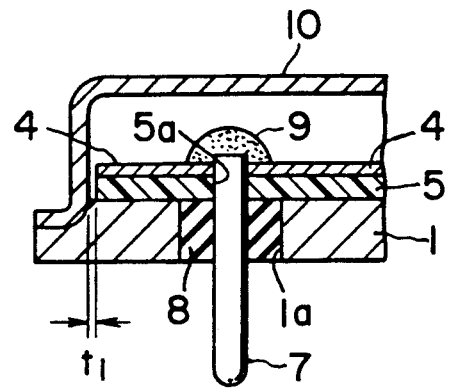
FIG. 3 is an enlarged view of the principal part of the conventional semiconductor device shown in FIG. 2.
Figure 4:
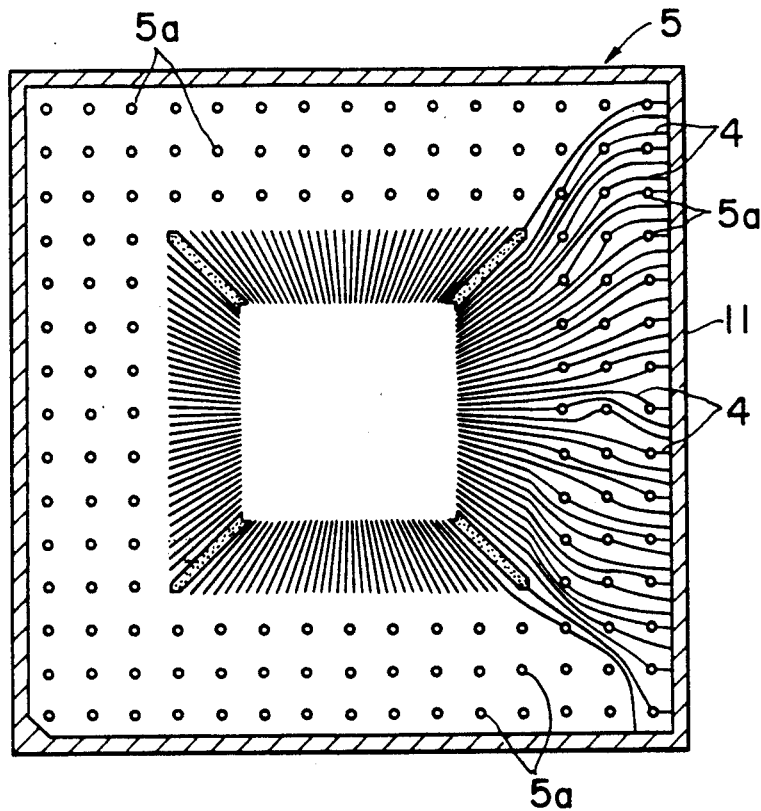
FIG. 4 is a top view of a printed circuit board when the inner ends of wiring patterns are gold plated.
Figure 5:
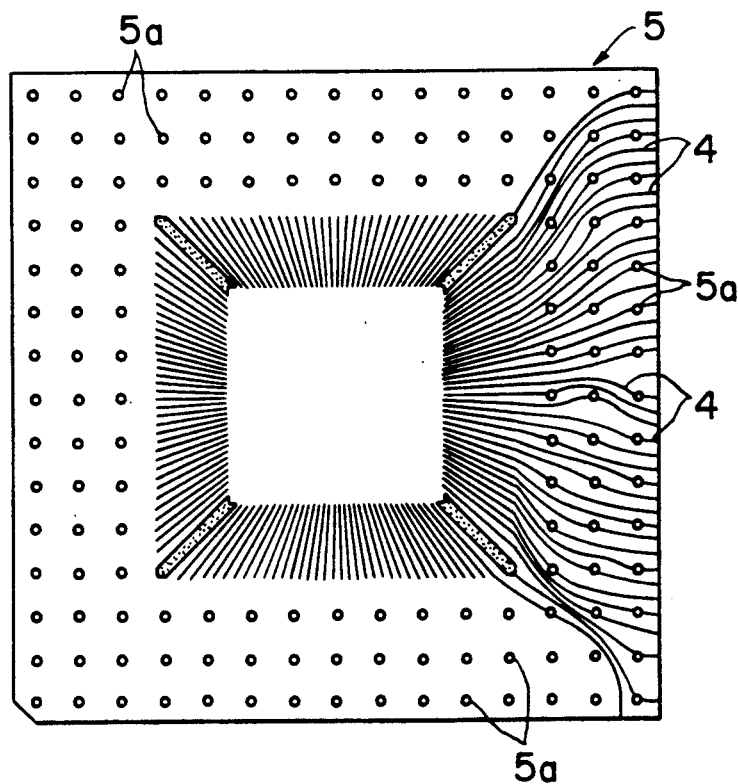
FIG. 5 is a top view thereof after the board has been completely fabricated.
Figure 6:
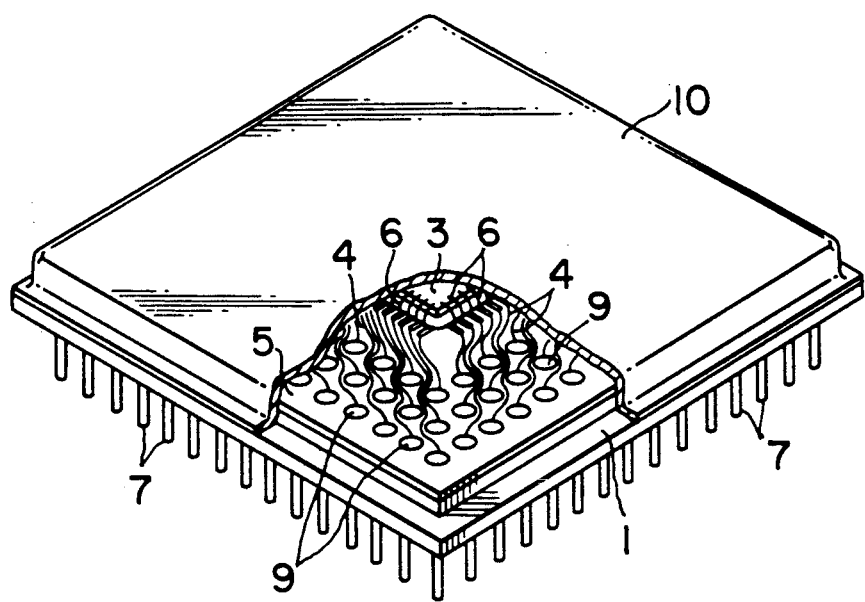
FIG. 6 is a perspective view showing a preferred embodiment of the semiconductor device in accordance with the present invention with one part cut away.
Figure 7:
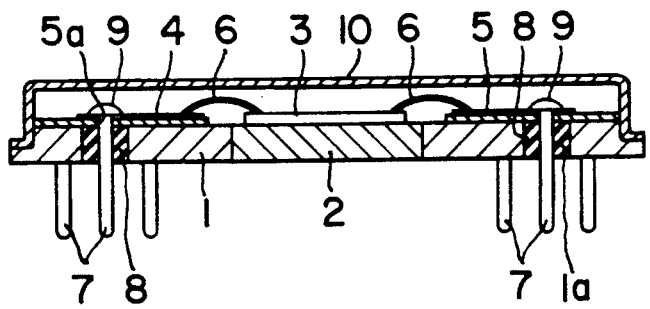
FIG. 7 is a longitudinal sectional view of the semiconductor device shown in FIG. 6.
Figure 8:
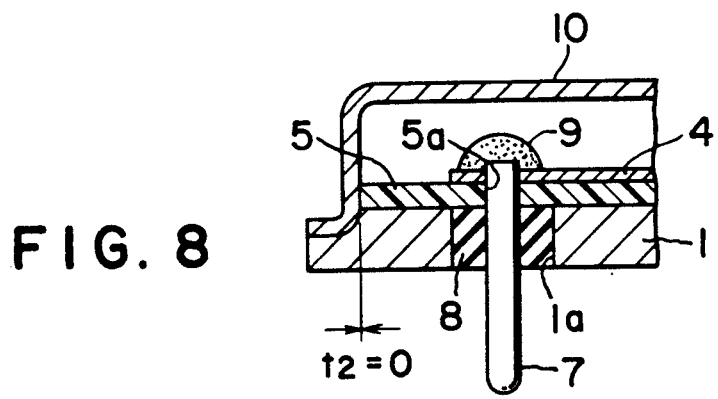
FIG. 8 is an enlarged view of the principal part of the device shown in FIG. 6.
Figure 9:
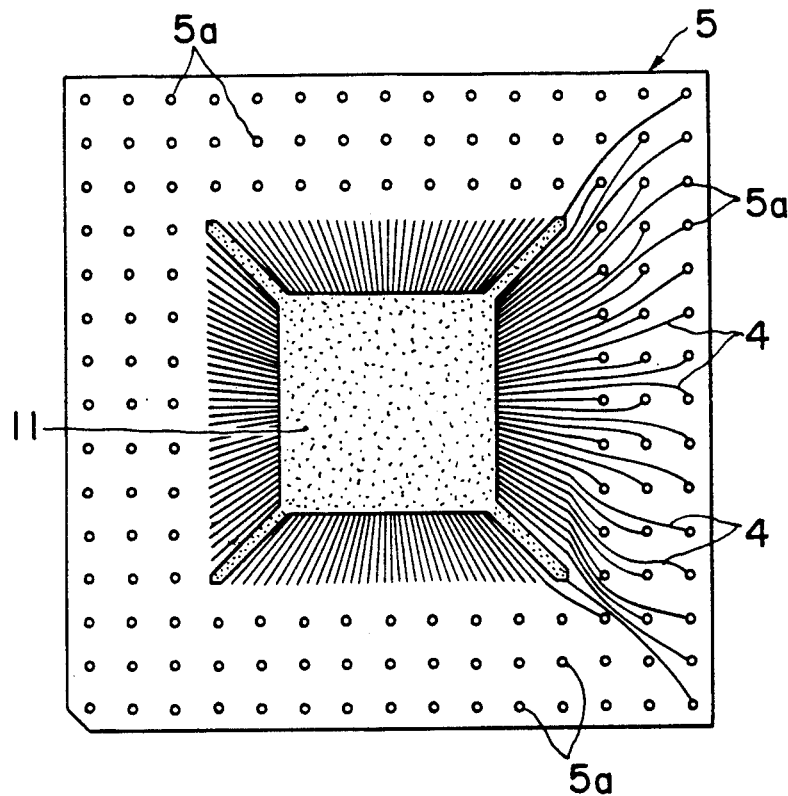
FIG. 9 is a top view of a printed circuit board when the inner ends of wiring patterns are gold plated.

In FIG. 7, a heat sink 2 is disposed substantially at the center portion of a metal base 1 and a semiconductor chip 3 is mounted on the upper surface of the heat sink 2. Overlaid over the metal base 1 is a printed circuit board 5 over the upper surface of which is defined predetermined wiring patterns 4 each of which extends radially and outwardly from the inner ends at the center portion. The printed circuit board 5 is made from a plastic film or the like and the wiring pattern 4 is made of copper or the like. The inner end at the center portion of each wiring pattern 4 is electrically connected to a corresponding bonding pad of the semiconductor chip 3 by means of a bonding wire 6 such as an aluminum wire. At the positions where a plurality of lead pins 7 are respectively provided from the base 1 under the board 5, a plurality of through holes 1a and 5a are bored such that both the holes 1a and 5a are made in alignment with each other and correspond to the lead pins 7, respectively, and the upper end of the particular lead pin 7 is inserted into the corresponding through holes 1a and 5a through an insulating member 8 such as glass which is filled in the annular space defined between the inner wall surface of the through hole 1a and the lead pin 7. Over the upper surface of the printed circuit board 5, the upper end of the pin 7 is electrically connected to the corresponding outer end of wiring patterns 4 by means of a connecting member 9 such as solder, and the lead pins 7 are mechanically joined to the board 5 and the base 1.

Furthermore, the semiconductor device constituted above, is covered with metal shell 10 and sealed airtight in the manner that the upper and the peripheral sides the wiring patterns 4 are covered by the metal shell 10.

Figure 10:
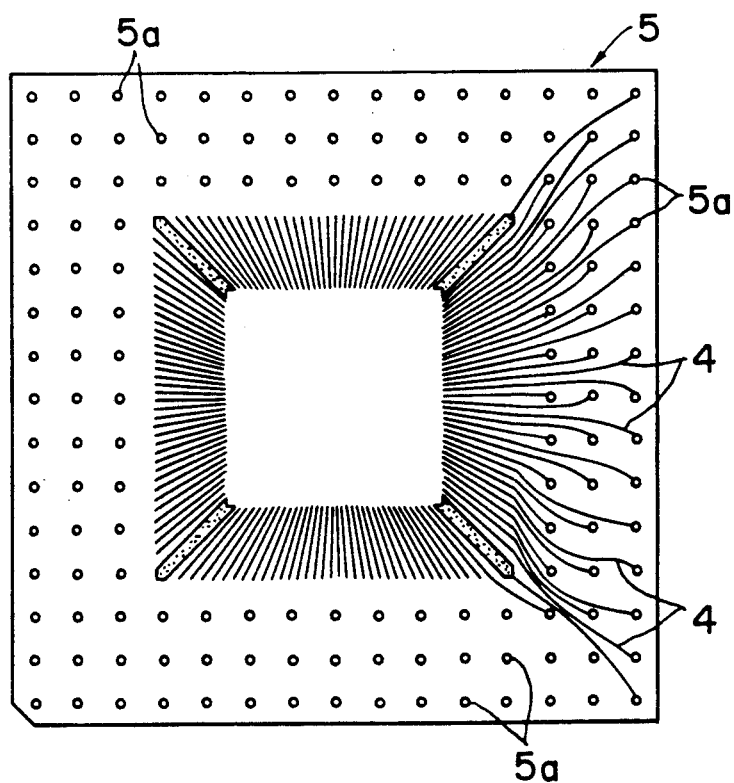
FIG. 10 is a top view thereof after the board has been completely fabricated.

The outer ends of the wiring patterns 4 which are formed in a radial manner from its inner end at the center portion of the upper surface of the board 5, as shown in FIG. 10 in detail, is only defined in the vicinity of the upper opening of the through holes 1a and 5a into which is inserted the lead pin 7, so that the outer end of the wiring patterns 4 is prevented from being exposed to the outer peripheral side surface of the printed circuit board 5.

Accordingly, even when the distance t2 between the inner surface of the upwardly extended portion of the metal shell 10 and the outer peripheral side of the printed circuit board 5 is zero (namely, t2=0), the electrical short circuiting between the wiring patterns 4 can be prevented.

Now, there will be explained the method for producing the above-constituted semiconductor device. In the case where the wiring patterns 4 defined on the printed circuit board 5 are formed by copper (Cu), it is necessary to stabilize the connection between the inner ends of the wiring patterns 4 and bonding wires 6 by gold plating to the starting ends of the patterns 4. Therefore, the first production step involves electrically connecting all inner ends of the wiring patterns 4 to each other as a patterning wiring layer 11 which is formed at the center portion of the board 5. Next, as the second production step, an electric current supplied through the patterning wiring layer 11, causes the wiring patterns 4 to be short-circuited over all the patterning portions thereof, so that the gold plating is performed. The third and final production step, after the gold plating is over, the patterning wiring layer 11 shown in FIG. 9, which is made up at the center portion of the board 5 and to which is supplied the current, is punched off in a predetermined shape and size by means of blanking or the like, so that the printed circuit board 5 is completely fabricated.

By the steps mentioned above, the production of the semiconductor device is accomplished.

What is claimed is:

1. A method for producing a semiconductor device which is constituted in that a semiconductor chip is mounted on a heat sink provided to a metal base; a printed circuit board including wiring patterns, which have central inner ends connected with bonding pads as input and output terminals of said semiconductor chip through bonding wires and outer ends of said patterns formed radially and connected to a plurality of lead pins projecting from the undersurface of the base, is superposed on the upper surface of the metal base; a metal shell is fitted to the metal base so as to cover said chip, said wires and said board:

wherein said printed circuit board of the semiconductor device is made up through;

the first step in which said wiring patterns are formed such that the inner ends are connected to each other at the center portion corresponding to said chip position so as to form a central portion patterning wiring layer, and outer ends of said patterns are located within through holes of said base and board corresponding to the outermost lead pins;

the second step in which a current supply causes said central portion patterning wiring layer to be electrically short-circuited in order to plate it with gold so that an electrical connection between said wiring patterns and bonding wires for connecting said chip can be effected; and the third step in which after said wiring pattern is plated with gold, said central portion patterning wiring layer is removed from said wiring patterns.

2. A method for producing a semiconductor device according to claim 1;

wherein said wiring pattern in the first step is formed of copper on a plastic film, and said bonding wires which are electronically connected to said wiring pattern in the second step are aluminum (A1).

3. A method for producing a semiconductor device according to claim 1, wherein said central portion patterning wiring layer is cut off by blanking.

* * * * *